United States Patent [19]

Araki et al.

[11] 4,437,232
[45] Mar. 20, 1984

[54] ELECTRONIC PARTS MOUNTING APPARATUS

[75] Inventors: Shigeru Araki, Katano; Yasuo Taki, Hirakata; Kazuhiro Mori; Yoshihiko Misawa, both of Katano; Souhei Tanaka, Hirakata, all of Japan

[73] Assignee: Matsushita Electric Industrial Co., Ltd., Osaka, Japan

[21] Appl. No.: 351,312

[22] Filed: Feb. 22, 1982

Related U.S. Application Data

[62] Division of Ser. No. 115,279, Jan. 25, 1980, Pat. No. 4,327,482.

[30] Foreign Application Priority Data

Jan. 25, 1979 [JP] Japan .................................. 54-7764

[51] Int. Cl.³ ..................... H05K 3/34; H05K 13/04
[52] U.S. Cl. ........................................ 29/740; 29/706; 29/714; 83/63; 228/6 A; 294/86 R; 294/106; 414/627; 414/730; 414/737; 414/744 B; 414/752
[58] Field of Search ................. 29/740, 741, 759, 834, 29/840, 714–719, 706; 228/6 A, 49 R; 414/730, 737, 744 B, 627, 752; 294/86 R, 106; 83/63; 227/1; 53/73, 57

[56] References Cited

U.S. PATENT DOCUMENTS

| | | | |
|---|---|---|---|
| 3,281,044 | 10/1966 | Kalning et al. | 227/1 |
| 3,344,900 | 10/1967 | Drop | 29/740 X |
| 3,685,716 | 8/1972 | Frankie et al. | 227/1 |
| 4,135,630 | 1/1979 | Snyder et al. | 29/740 X |

Primary Examiner—Carl E. Hall
Attorney, Agent, or Firm—Wenderoth, Lind & Ponack

[57] ABSTRACT

An electronic parts mounting apparatus using a band carrier for feeding electronic parts incrementally, the carrier being a strip having many recesses disposed at equal intervals each holding an electronic part and a tape covering the recesses. The apparatus has a support for horizontally supporting the carrier with the coating tape on the top side; a separator for separating the tape from the carrier; and a pickup device for picking up the electronic parts one by one from the recesses in the carrier and by carrying the electronic parts and placing them in position on a circuit board for continuously and stably mounting the electronic parts on the circuit board.

1 Claim, 21 Drawing Figures

Fig. 1
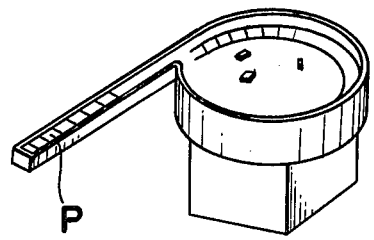
Fig. 2(a)
Fig. 2(b)
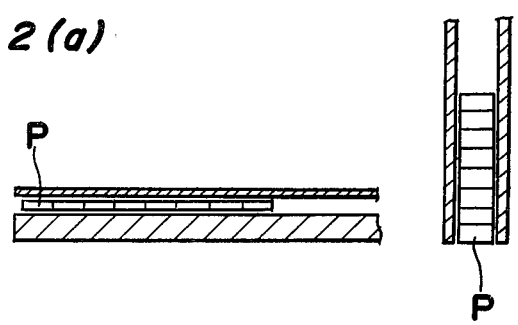
Fig. 3
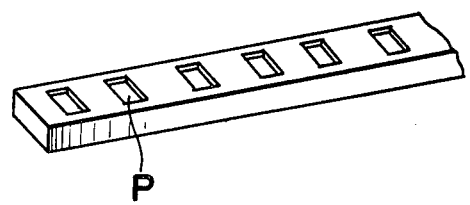

ELECTRONIC PARTS MOUNTING APPARATUS

This is a divisional application of application Ser. No. 115,279, filed Jan. 25, 1980 now U.S. Pat. No. 4,327,482.

The present invention relates to a mounting apparatus for electronic parts and, more particularly, to an apparatus for carrying and placing leadless microelectronic parts onto an electronic circuit board or the like to be assembled into an electronic appliance.

In an apparatus for mounting, on a board or substrate for an electronic circuit, a leadless type microelectronic part such as a tip type resistor or tip type layer-built capacitor (hereinafter referred to as tip parts P), there is employed an aligning and feeding system, a magazine delivery system and a carrier magazine system as a means for feeding the tip parts to the mounting board, the aligning and feeding system arranging the loose parts P in a line by an oscillating type feeder as shown in FIG. 1, the delivery magazine system providing a guide chute for aligning the tip parts P in a horizontal or vertical direction to feed the parts one-by-one as shown in FIGS. 2(a), 2(b), and the carrier magazine system employing a magazine having recesses at equal intervals therein to receive and carry the tip parts P as shown in FIG. 3. In the oscillation type feeding system of FIG. 1, the oscillation type feeder is used for aligning the loose parts being supplied at random in a hopper in a line so that a large space is required for the hopper and the bad influences may be exerted upon the tip parts through vibrations or the parts may be clogged halfway along the line of parts. On the contrary, in the magazine delivery system of FIG. 2, the tip parts are fed rather positively by a push rod, so that more time is required to recover from clogging, and generally the stock of parts cannot be increased. Also, according to the carrier magazine feeding system of FIG. 3, a stable feeding operation is provided, but a larger carrier magazine is required for the micro-parts, and a larger space and complicated delivery apparatus are required for the automatic supply by the carrier magazine.

A principal object of the present invention is to provide an electronic parts mounting apparatus which feeds tip parts to a mounting means by a band carrier in the form of a flexible strip with tip parts loaded thereon at equal intervals, and which strip is wound in a roll with one end supplied to the mounting means, thus allowing the tip parts to be continuously fed in a stable manner for attachment to the circuit board.

Another object of the present invention is to provide an electronic parts mounting apparatus which can eliminate the disadvantages inherent in the conventional system and which makes it possible to perform the carrying and placing of tip parts at a higher speed and with better positional accuracy with respect to the printed circuit board or the like, than heretofore.

According to the present invention, there is provided a mounting apparatus for carrying and placing onto an electric circuit board tip parts carried within a band carrier, which includes a strip of flexible material having a plurality of hollows at equal intervals in a line therealong and each carrying a tip part therein and a tape attached to the strip to cover all of the hollows, said apparatus comprising a body frame, a means for holding said carrier wound in a roll, a means for intermittently feeding said carrier in increments corresponding to the intervals between said hollows in one direction, a means for separating the tape from the strip, a means for supporting the strip of said carrier from which the tape has been removed in a horizontal position with the tip parts within the hollows of the strip being exposed on the top of the strip, a means for picking the tip parts up one by one from the hollows of the strip, and a means for moving the picking means together with the tip parts to a desired position to place the tip parts onto the circuit board, thus allowing the tip parts to be continuously and stably mounted on the circuit board.

These and other objects, features, aspects and advantages of the present invention will become more apparent from the following detailed description of one preferred embodiment taken in conjunction with the accompanying drawings, in which:

FIG. 1 is a perspective view showing an oscillation type feeding hopper employed within a conventional apparatus;

FIGS. 2a and 2b are cross-sectional views each showing a guide chute employed within a conventional apparatus;

FIG. 3 is a perspective view showing a carrier magazine employed within a conventional apparatus;

Before the description of the present invention proceeds, it is to be noted that like parts are designated by like reference numerals throughout the accompanying drawings.

Figure 4:
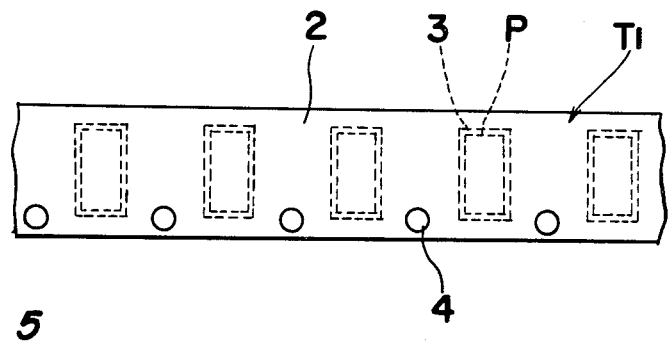
FIG. 4 is a top plan view showing one embodiment of a tip parts carrier used with the apparatus of the present invention.

Referring first to FIGS. 4 to 7, there are shown two embodiments of band carriers T for use in the apparatus of the present invention, each of which includes a strip 1 of flexible material having a lot of hollows 3 at equal intervals in a line therealong and each carrying a tip part P therein and a tape 2 attached to the top of the strip to cover all of the hollows 3, said carrier T having a lot of perforations 4 at equal intervals corresponding to the hollows 3 for detachably engaging with a reciprocating pawl 11 of feeding means provided in the apparatus so as to feed the collector T by the pawl 11. The carrier is adapted to be wound up on a reel 6 provided in the apparatus in a helical coil with one end being able to be drawn out of the coil.

Figure 5:
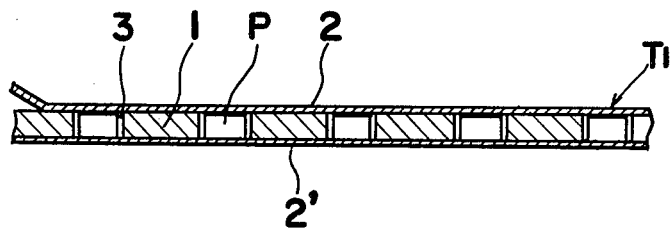
FIG. 5 is a cross-sectional view of the tip parts carrier of FIG. 4.

FIGS. 4 and 5 show one embodiment of a band carrier T1 comprising a strip 1 of flexible plastic material having a lot of holes 3 at equal intervals in a line each for receiving a tip part P therein, the tip parts P being freely dropped into the receiving holes 3, and a pair of flexible plastic tapes 2 and 2', one tape 2' being fixed by a bonding agent, mechanical coupling or thermal adhesion under pressure onto the bottom side of the strip 1 to cover the bottoms of the holes 3 so as to form the hollows in the strip 1 for accommodating the tip parts P therein, while the other tape 2 is detachably attached by a bonding agent, mechanical coupling or thermal adhesion under pressure onto the top of the strip 1 to cover the hollows so as to enclose the tip parts P within the holes 3 in the strip and between the pair of tapes 2 and 2', the other tape 2 being easily removable from the strip 1 by the application of an external force for peeling off the other tape 2. Also, the carrier T1 has a lot of perforations 4 along the edge portion thereof at equal intervals corresponding to and between the holes 3, the perforations 4 extending through the strip 1 and the pair of tapes 2 and 2' and having a size for being engaged by the pawl 11 of the apparatus. The carrier T1 is prepared in advance with the tip parts P within the hollows 3 with the pair of the tapes 2 and 2' attached to the strip band 1 and with the perforations 4 therethrough, and is adapted to be wound in a coil on the reel 6 of the apparatus with one end able to be drawn out and fed to a picking means provided in the apparatus by the engagement of the pawl 11 of the apparatus in the perforations 4 in the carrier. When the tape 2 provided on the top side of the strip band 1 is separated from the strip 1 by the application of an external force, the tip parts P are exposed so that they can be taken out of the hollows of the carrier T1 without any trouble.

Figure 6:
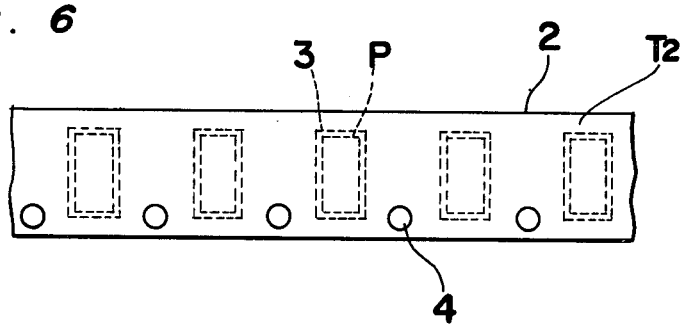
FIG. 6 is a top plan view showing another embodiment of a tip parts carrier used with the apparatus of the present invention.
Figure 7:
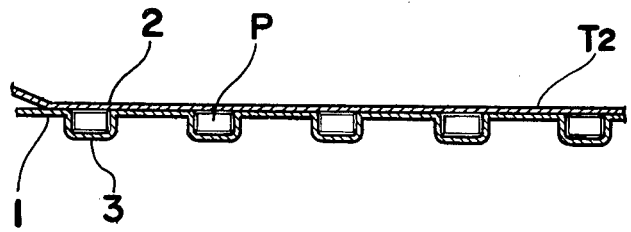
FIG. 7 is a cross-sectional view of the tip parts carrier of FIG. 6.

FIGS. 6 and 7 show another embodiment of a band carrier T2 comprising a strip 1 of flexible metal having a lot of concavities 3 at equal intervals in a line and constituting the hollows for receiving tip parts P therein, the tip parts P being freely dropped into the concavities 3, and a flexible paper tape 2 detachably attached by a bonding agent, mechanical coupling or thermal adhesion under pressure onto the top side of the strip 1 to cover the openings of the concavities 3 so as to enclose the tip parts P within the concavities 3 of the strip 1, the carrier T2 having a lot of perforations 4 at equal intervals corresponding to the hollows 3 and each passing through the strip 1 and the tape 2 and having a size for being engaged by the pawl 11 of the apparatus. The carrier T2 is also adapted to be prepared in advance in the same manner as the carrier T1 and to be used in the apparatus of the present invention as described hereinafter.

Now, referring to FIGS. 8 to 16, there is shown the apparatus of the present invention comprising a frame 10, a first reel 6 for holding the wound carrier T with tip parts P thereon, a second reel 8 for winding up the tape 2 which has been separated from the strip 1 to expose tip parts P within the hollows 3 of the strip 1, a guide rail 9 with a cover 12 for holding the strip 1 from which the tape 2 has been separated against the rail 9 and to guide the strip 1 forward with the tip parts P within the hollows 3 of the strip 1 being horizontally conveyed along the top side of rail 9, a feeding means including a reciprocating pawl 11 to be engaged with each of the perforations 4 provided in the carrier T to feed said carrier T along the rail 9 intermittently a distance corresponding to the intervals between the hollows 3 in the band 1, a pick up means including a suction head 14 connected with a source S of vacuum for picking up the tip parts P one by one from the hollows 3 in the band 1 in association with the chucking operation of a position regulating mechanism, and a moving means including at least one rod 15 provided on the body 10 so as to guide said pick up means together with a tip part P which has been picked up to a given position above a circuit board 13 to mount the tip part P onto the circuit board 13, the moving means further having a rotary mechanism for shifting the position of the tip part being carried by the pick up means by 90°.

Figure 8:
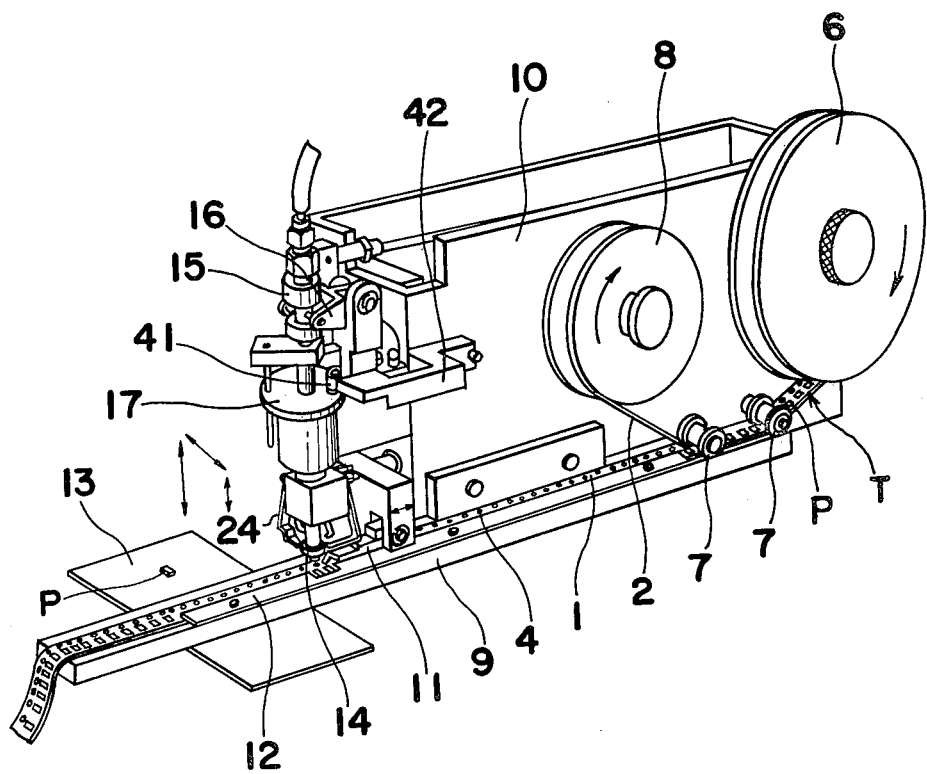
FIG. 8 is a perspective view showing one embodiment of a tip parts mounting apparatus according to the present invention.

Referring to FIG. 8, the band carrier T is wound on the first reel 6 rotatably mounted on the frame 10, and the free end of the carrier T is drawn off the first reel 6 and is guided by a pair of guide rollers 7 to the guide rail 9. At the downstream end of the guide rollers 7, the tape 2 on the carrier T is peeled off the strip T in a known manner and is wound up around the second reel 8 which is rotatably mounted on the frame 10 and is driven so as to rotate in the clockwise direction in synchronization with the operation of the feeding means by a driving means (not shown) provided in the frame 10, the strip 1 from which the tape 2 has been separated being guided on the guide rail 9 toward the feeding means.

Figure 16:
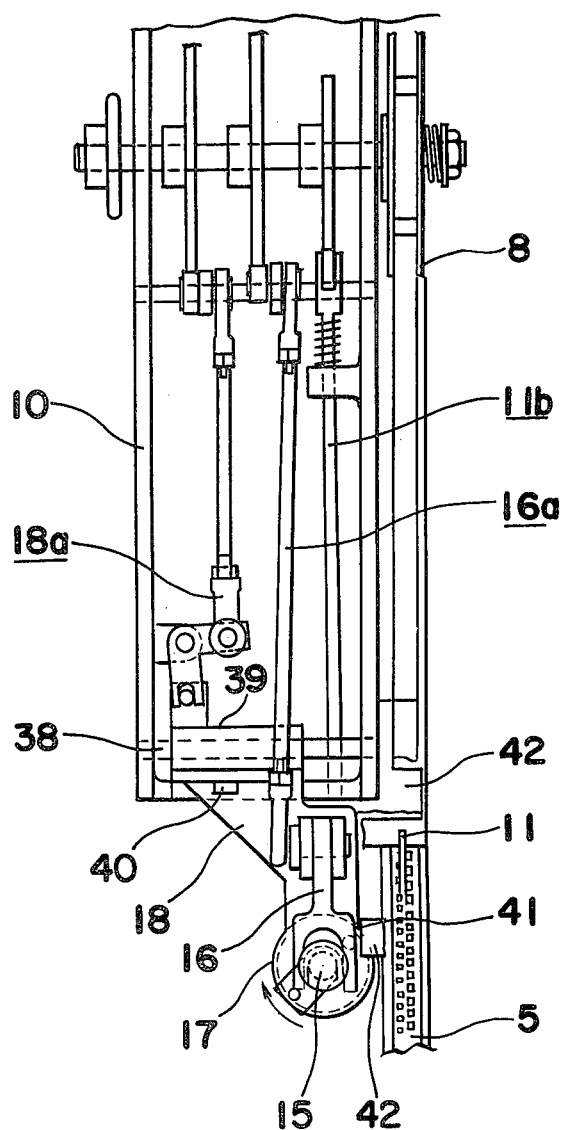
FIG. 16 is a partial plan view, on an enlarged scale, showing a driving mechanism for the feed pawl employed in the apparatus of FIG. 8.

At the front end of the frame 10, there is provided the reciprocating pawl 11 which is operated so as to move with a reciprocating motion along the guide rail 9 by a conventional driving means and is adapted to engage with each of the perforations 4 in the carrier T to move the carrier T intermittently towards the picking means. The conventional driving means for the reciprocating pawl 11 is provided within the frame 10 and includes a crank mechanism 11b driven by a motor (not shown) in a known manner, as shown in FIGS. 9 and 16. When the pawl 11 returns from the advanced position to the initial position in its reciprocating movement, the tapered face 11a provided on the rear portion of the front end of the pawl 11 rides smoothly up onto and slides along the upper surface of the strip 1 as the pawl 11 is disengaged from the perforation 4 of the strip 1, thereby to prevent the strip 1 from returning to its former position, as shown in FIG. 9(b). The strip 1 together with tip parts P are intermittently fed by the reciprocating motion of the pawl 11 along the guide rail 9 toward the picking means at pitches corresponding to the intervals between the perforations 4 of the strip 1.

Near the front end of the guide rail 9, there is provided the suction head 14 which is operated to pick up the tip parts P from the strip 1 by a vacuum-adhering operation and moved by the moving means to carry the tip parts P and place them onto the circuit board 13, the circuit board 13 being positioned adjacent the front end of the frame 10. When the suction head 14 is operated to pick up the tip parts P from the strip 1, the feeding means is stopped so that the strip 1 is held at a fixed position, and the feeding means is actuated to operate the pawl 11 for moving the strip 1 forward after the tip part P picked up by the suction head 14 is moved away from the strip 1 by the actuation of the pick up means and the moving means. After completion of the operation of the pick up means and the moving means through one cycle, which extends from the feeding operation of the feeding means to the picking up and moving operations of the pick up means and the moving means in order to carry the tip parts P and mount them on the circuit board 13, either the circuit board 13 with the tip parts P mounted thereon or the frame by itself is shifted to a new position to permit replacement of the circuit board 13 by a new one. Also, by repeating a cycle identical to the above-described cycle, the next tip parts P on the strip band 1 will be mounted on the new circuit board 13 in succession one after another.

The construction and operation of the pick up means and the moving means provided in the frame 10 will be described hereinafter in detail with reference to FIGS. 9 to 16.

Referring to FIG. 9, a suction head 14 of the picking means is mounted as one unit on the lower end of a rod 15, the upper end of which is provided with a flange 15a connected with a vacuum source S through a flexible hose H. The rod 15 with the suction head 14 is movable in a vertical, axial direction so as to enable it to perform its vertical shift operation, by means of actuating members including roller 31 rotatably provided on an actuating lever 16, sliding ring 32 slidably mounted on the rod 15, lever 34 secured to the rod 15, and compression spring 33 provided between the sliding ring 32 and the lever 34, said vertical shifting operations thereof being produced by swinging of the roller 31 on the lever 16 by an external means 16a (see FIG. 16), so as to push the lever 34 on the rod 15 downwardly through sliding ring 32 and spring 33. The roller 31 does not interfere with the rotation of the sliding ring 32 around the rod 15 and is engaged with the sliding ring 32 and the flange 15a on the rod 15 so that they move together in the axial direction of the rod 15. The compression spring 33 is provided between the sliding ring 32 and the lever 34 to keep the depressing force on the suction head 14 against the tip parts P at a given value. The rod 15 and the suction head 14 respectively have along their axial center line vertical holes 15a and 14a which are connected with each other for exerting suction on the tip parts P at the lower end of the suction head 14 and connected at the upper other end of the flange 15a of the rod 15 to the vacuum source S through the hose H. The rod 15 is slidably mounted in and passes through an axial hole in a rotary boss 17 mounted on a moving block 18 so as to be supported for vertically slidable movement therein. Also, a guide pin 35 which is mounted on the lever 34 on the rod 15 is slidably inserted within a vertical hole 17a in the rotary boss 17 to provide a stop for blocking the rotation of the rod 15 relative to the rotary boss 17. The rotary boss 17 is rotatably supported in bearings 36 on a moving block 18 which is movable horizontally by an external means 18a (see FIG. 16). The moving block 18 is fixed by a bolt 40 on a sliding block 39 which is slidably mounted on two guide rods 38 and 38' secured to the body frame 10.

The rotary mechanism for rotating the rod 15 through 90° will be described hereinafter with reference to FIGS. 8 and 9. A roller 41 is mounted on the rotary boss 17 and is normally urged by a spring means into contact with a cam 42 which is secured to the frame 10 and which has a shape to stop the roller 41 so as to guide the roller 41 to cause it to be rotated by the urging force of a spring means. The spring means is a tension spring 45 provided between one pin 43 secured to the rotary boss 17 and another pin 44 secured to the moving block 18. The rotation of the rotary boss 17 through 90° is achieved by the guidance of the cam 42 with which the roller 41 of the rotary boss 17 is normally engaged by the spring means during the horizontal movement of the moving block 18 along the guide rods through a given distance. A releasing mechanism for ending the rotary operation of the rod 15 includes a metal stop 47 which is mounted on the actuator of an air cylinder 46 secured to the sliding block 39 so as to move in the direction toward and away from the block 39 by the operation of the air cylinder 46. When the rotation of the rod 15 through 90° is intended to be released, the stop 47 is advanced by the operation of the air cylinder 46 to engage with the pin to depress the rotary boss 17 at a given location in order to block the urging force of the tension spring 45 for causing the rotation of the rotary boss 17, thereby to release the roller 41 from the cam 42.

The position regulating mechanism to be operated during the carrying and placing of the tip parts will be described hereinafter. A sliding boss 20 is slidably provided around the outer periphery of the rotary boss 17 and is disposed below the bearings 36 and is supported on the suction head 14 on the rod 15 so as to be slidable in the vertical direction along the rotary boss 17, a compression spring 19 being provided between the bearing 36 and the sliding boss 20 to push the sliding boss 20 toward the suction head 14. A guide pin 21 is secured on the rotary boss 17 and is slidably engaged in a long hole 20a provided in the sliding boss 20, so that the sliding boss 20 is rotated together with the rotary boss 17 by the engagement between the guide pin 21 and the sliding boss 20 and is movable along the boss 17 by the sliding of the guide pin 21 within the long hole 20a in the sliding boss 20.

Figure 10:
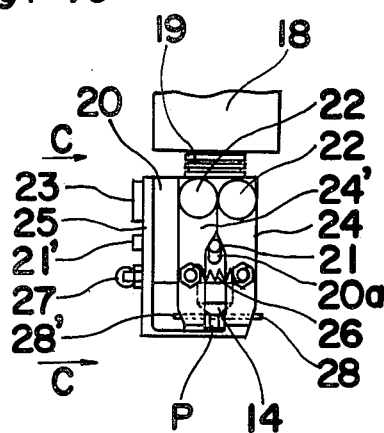
FIG. 10 is a front view viewed from the position of line A—A in FIG. 9(a)
Figure 11:
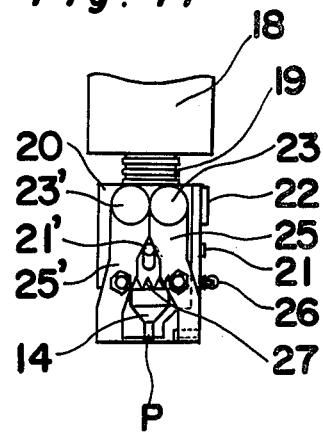
FIG. 11 is a side-elevational view viewed from the position of line C—C in FIG. 10.

Supporting point shafts 22 and 22' are mounted, by screws, on one side of the sliding boss 20, and position regulating pawls 24 and 24' are rotatably mounted on the respective supporting point shafts 22 and 22'. In FIG. 9, the suction head 14 is in its raised position and the rod 15 pulled upward by the roller 31 against the force of spring 19, and the upper shoulder 14' of the suction head 14 pushes the sliding boss 20 up to a position in which the guide pin 21 is positioned in the lower portion of the hole 20a of the sliding boss 20 and the position regulating pawls 24 and 24' are closed so as to clamp a part P between the free ends thereof for regulating the position of the part P, as shown in FIGS. 10 and 11. On the contrary, when the suction head 14 is in its lowered position in association with the downward movement of the rod 15, the sliding boss 20 is pushed downwardly by the compression spring 19 to a position in which the guide pin 21 is positioned in the upper portion of the hole 20a so as to be moved between the position regulating pawls 24 and 24', so that the free ends of the positioning regulating pawls 24 and 24' are spread apart from each other for releasing the part P.

Figure 12:
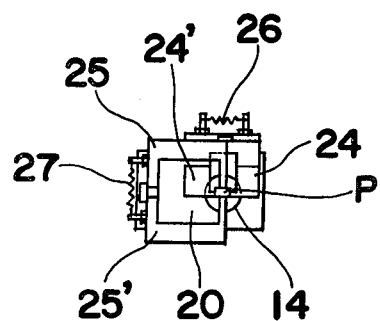
FIG. 12 is a bottom view viewed from the position of line B—B in FIG. 9(a)
Figure 13:
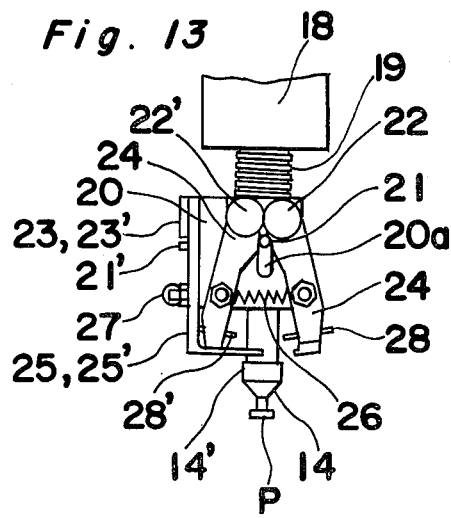
FIG. 13 is a front view similar to FIG. 10 with the parts in the condition where the position regulating pawls are open.
Figure 14:
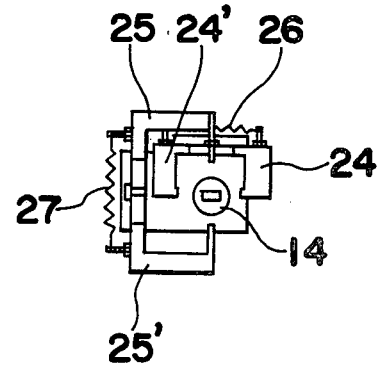
FIG. 14 is a bottom view similar to FIG. 12 with the parts in the condition where the position regulating pawls are open.

The construction of the regulating pawls will be described hereinafter in detail with reference to FIGS. 10 to 14. Referring to these views, two sets of the supporting point shafts 22 and 23, and 22' and 23' are mounted by screws on the two sides, i.e., the front and side faces of the sliding boss 20, the two sides being adjacent and normal to each other. The position regulating pawls 24 and 24', and 25 and 25', are engaged, respectively, with each other through partial gears provided thereon so as to be rotatable in opposite directions around these supporting point shafts 22 and 23, and 22' and 23', the free ends of the position regulating pawls 24 and 24' facing each other on a line in an imaginary horizontal plane disposed below the suction head 14 as shown in FIG. 12, while the free ends of the position regulating pawls 25 and 25' face each other on another line perpendicular to the line within the imaginary plane A pair of tension springs 26 and 27 are mounted, respectively, between the position regulating pawls 24 and 24', and between the position regulating pawls 25 and 25' to urge the pawls to the closed position or toward each other. FIG. 10 to FIG. 12 show, respectively, one state of the ascending suction head 14 in which each pair of the position regulating pawls 24, 24' and 25, 25' are kept closed by the force of tension springs 26 and 27 to hold the free ends thereof in engagement with the four corners of a tip part P being sucked up by the suction head 14 in order to grasp the tip part P from four directions by the free ends thereof, while FIG. 13 and FIG. 14 show, respectively, the other state of the descending suction head 14 in which each pair of the position regulating pawls 24, 24' and 25, 25' are kept opened against the forces of tension springs 26 and 27 to spread the free ends thereof away from the tip part P being held by the suction head 14 so as to release the tip part P from the position regulating pawls 24, 24' and 25, 25'. Accordingly, referring to these views, as the suction head 14 of the rod 15 descends due to the clockwise rotation of the lever 16, the sliding boss 20 follows the suction head 14 due to the action of the compression spring, and the upper shoulder 14' of the suction head 14 remains in contact with the underside of the sliding boss 20, until the upper portion of the long hole 20a comes into contact with the guide pin 21. At this time, since the guide pin 21 is secured to the rotary boss 17 at a fixed position, the position regulating pawls 24, 24' are separated from each other by the guide pin 21 disposed between the position regulating pawls 24 and 24' against the force of the tension spring 26, as shown in FIG. 13. Likewise, the position regulating pawls 25, 25' are separated from each other by the guide pin 21' disposed between the position regulating pawls 25 and 25' against the force of the tension spring 27. The tip part P held by the suction head 14 can be placed in position without interference from the position regulating pawls 24, 24' and 25, 25' which are spaced from the component by the above operations thereof. On the contrary, when the suction head 14 of the rods 15 ascends during the counterclockwise rotation of the lever 16, the two sets of position regulating pawls 24 and 24' and 25, 25' are respectively closed to engage and hold a part P therebetween as described above.

In addition, a pair of detecting electrodes 28 and 28' are provided, respectively, on the position regulating pawls 24, 24' for detecting the presence of the tip parts therebetween, as shown in FIG. 4. When the suction head 14 fails to pick up a tip part P in the position between the detecting electrodes 28, 28' the position regulating pawls 24, 24' rotate toward each other until the opposed ends of the electrodes 28 and 28' are brought into contact with each other and an external circuit, not shown, connected with the detecting electrodes 28 and 28' is energized by the contacted electrodes 28 and 28' to provide a signal indicating the non-absence of a tip part P on the suction head 14. On the contrary, when a tip part P is picked by the suction head 14, the external circuit is not energized by the electrodes 28 and 28' since they do not come into contact.

The operation of the apparatus having the construction described above will be described hereinafter with reference to FIG. 9 to FIG. 15. Referring to the views of FIGS. 15(a) to 15(d), only the movement of the position regulating pawls 24 and 24' in one direction of the two position regulating directions of the position regulating pawls 24, 24' and 25, 25' is shown for the sake of brevity, and the movement of the position regulating pawls 25 and 25' in the other direction can easily be understood from the operation of the position regulating pawls 24 and 24'.

Figure 15A:
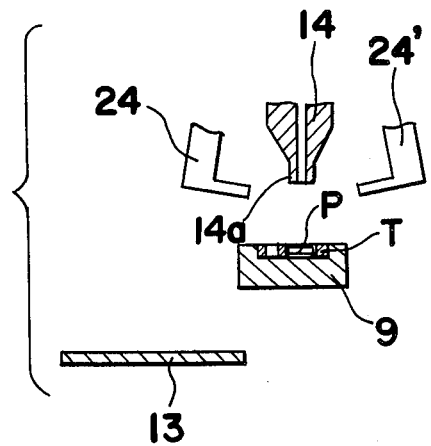
FIGS. 15a–15d are schematic views showing a position regulating means for the tip parts employed in the apparatus of FIG. 8, for the purpose of illustrating how to regulate the position of a tip parts.
Figure 15C:
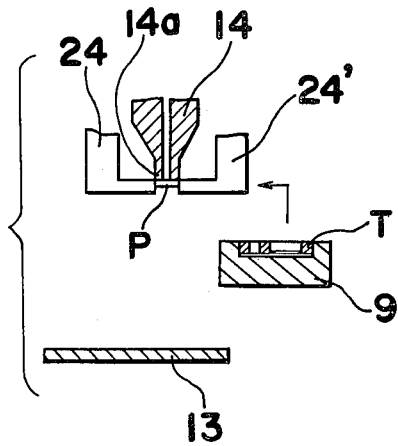
Figure 15B:
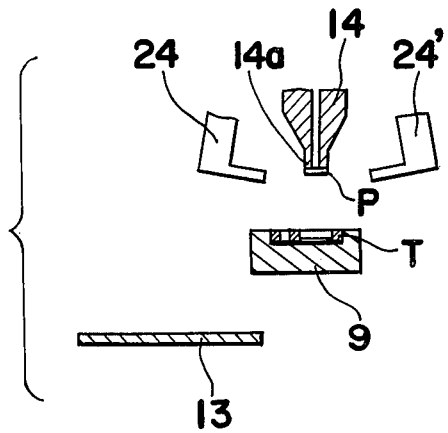
Figure 15D:
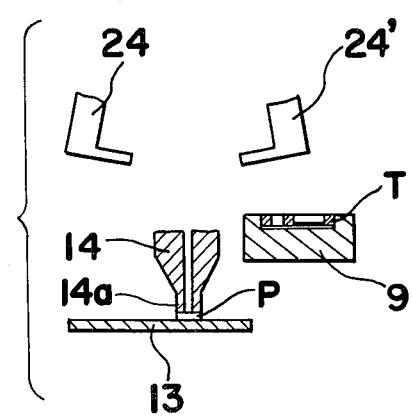

Referring to FIG. 15(a), the tip parts P are delivered in one row along the guide rail 9. Firstly, the position regulating pawls 24 and 24' are open when the suction head 14 moves down to pick up a tip part P on the band 1. Then, as seen in FIG. 15(b), the tip part P is picked up by the suction head 14 but, at this time, the position regulating pawls 24 and 24' are kept open. As shown in FIG. 15(c), the position regulating pawls 24 and 24' are closed, and the suction head 14 carries the tip part P from the guide rail 9 to a point above a given position on the circuit board 13. As seen in FIG. 15(d), the position regulating pawls 24 and 24' are opened and the suction head 14 has descended, thereby to place the tip part P on the board 13.

Figure 9A:
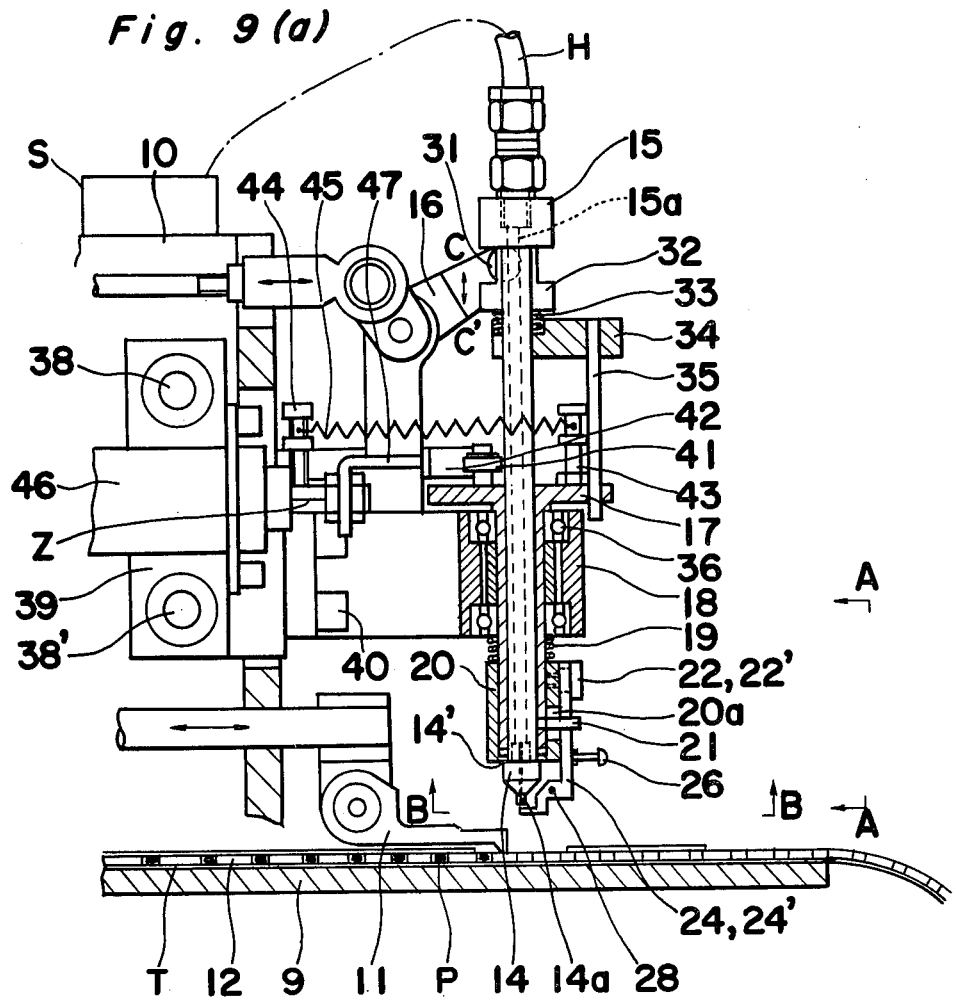
FIG. 9(a) is a partial cross-sectional view showing a tip parts carrying and loading mechanism employed in the apparatus of FIG. 8.
Figure 9B:
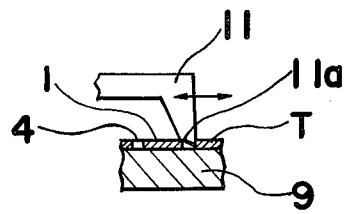
FIG. 9(b) is an enlarged side-elevational view of one portion of a feed pawl employed in the mechanism of FIG. 9(a)

In FIG. 9(a), in which the parts are in positions corresponding to FIG. 15(a), when the lever 16 is turned in the clockwise direction C' by an external means such as a piston-cylinder device in a known manner, the sliding ring 32 is moved downwardly by the roller 31 which, through the urging force of the compression spring 33 acting on lever 34 moves the rod 15 downwardly. When the suction head 14 moves downwardly with the rod 15 and comes into contact with the tip part P on the carrier delivered along the guide rail 9, the suction force of the vacuum source S is applied through the bore 15a and hole 14a to suck one tip part P against the suction head 14. Also, the sliding boss 20 is pushed downwardly by the resilient force of the spring 19 to open the position regulating pawls 24, 24' and 25, 25' between which the guide pins 21 and 21' of the rotary boss 14 are positioned against the resilient force of the springs 26 and 27, as shown in FIG. 13. After sucking the one tip part P against the suction head 14, the lever 16 is turned in the counterclockwise direction C to raise the suction head 14 together with the rod 15 and lever 34 and spring 33 and ring 32. The condition where the upper shoulder 14' of the suction head 14 is moving upward in contact with the underside of the sliding boss 20 against the force of spring 19 corresponds to FIG. 15(b). When the lever 16 is turned through a given stroke in the direction C against the resilient force of the spring 19, sliding boss 20 is moved upwardly by the suction head 14 until the position regulating pawls 24, 24' and 25, 25' are released from the guide pins 21, 21' and are closed by tension springs 26 and 27 to hold the part held on the suction head 14 therebetween. Accordingly, the position regulating pawls 24, 24' and 25, 25' are closed, respectively, from the opened conditions to hold the tip part P, and the presence of the part P is detected by the detecting electrodes 28 and 28'. Thus, the movement of the tip part P can be carried out smoothly, since the tip part is moved together with the suction head 14 in the direction of sliding of the rod 15 which is parallel to the direction of the suction force on the tip part P by the suction head 14 and is perpendicular to the direction of movement of the moving block 18. FIG. 15(c) shows the condition where the moving block 18 is moved to a given position by movement in the direction along the guide rods 38 and 38' by the conventional external means with the tip part P being held in position by the suction head 14 and the position regulating pawls 24, 24' and 25, 25', the rod 15 and the suction head 14 being rotated through 90° by the rotary mechanism if necessary. By rotation of the lever 16 in the clockwise direction C' from this position, the rod 15 and the suction head 14 are lowered together with boss 20 and the guide pins 21 and 21' which are thereby positioned at the upper portion of the hole 20a to open the position regulating pawls 24, 24' and 25, 25'. Before the upper shoulder 14' of the suction head 14 separates from the sliding boss 20, the sliding boss 20 is lowered by the urging force of the compression spring 19 and the guide pins 21 and 21' relatively ascend within the hole 20a by a given distance to open the position regulating pawls 24, 24' and 25, 25'. When the suction head 14 descends further following rotation of the lever 16, only the suction head 14 reaches the board 13 to engage the tip part P with the board 13. FIG. 15(d) shows this condition. This is the end of one cycle of operation of the apparatus.

The apparatus of the present invention is advantageous in that the tip parts can be positively fed to a given position in a stable state and be properly held in position during the picking up, carrying and placing operations of the tip parts. The presence of the parts picked up by the suction head is detected by sensing the positions of the position regulating pawls.

Although the present invention has been fully described in connection with one embodiment, it is to be clearly understood that the same is merely by way of example, the spirit and scope of the present invention being limited only by the terms of the appended claims.

What is claimed is:

1. An apparatus for carrying and placing components onto a board or the like, comprising:
    a body frame fixed at a position on a plane;
    a rod means movably supported on said body frame for movement in vertical and horizontal directions with respect to the plane;
    a first movable means connected to said rod means for moving said rod means in the vertical direction with respect to the plane;
    a second movable means connected to said rod means for moving said rod means in the horizontal direction with respect to the plane;
    a suction tool provided at a lower end of said rod means for picking up a component;
    a suction means connected to said suction tool for supplying a vacuum to said suction tool when said suction tool is carrying a component;
    at least one pair of positioning pawls rotatably mounted on said rod means and having free ends for grasping and positioning a component therebetween when the free ends are moved towards each other;
    means for rotating said positioning pawls in synchronization with the movement of said rod means for causing the free ends to move away from each other when said rod means is in a lowered position to pick up a component and for causing the free ends to come close to each other when said rod means is in a raised position to bring the free ends into engagement with a component picked up by said suction tool; and
    a pair of electrodes, one on each of the positioning pawls for contacting each other and abruptly conducting a predetermined level of current therebetween when said free ends of said positioning pawls move clower to each other than they move when a component is located therebetween, whereby an instantaneous signal indicating the absence of a component is directly produced.

* * * * *